United States Patent
Fujii

(10) Patent No.: US 8,551,369 B2
(45) Date of Patent: Oct. 8, 2013

(54) WIRING MATERIAL, METHOD OF MANUFACTURING WIRING, AND NANO-PARTICLE DISPERSION

(75) Inventor: Takamichi Fujii, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 145 days.

(21) Appl. No.: 13/250,142

(22) Filed: Sep. 30, 2011

(65) Prior Publication Data

US 2012/0082780 A1    Apr. 5, 2012

(30) Foreign Application Priority Data

Oct. 1, 2010   (JP) ................................. 2010-224031

(51) Int. Cl.
*H01B 1/12* (2006.01)
*H01B 1/02* (2006.01)
*B05D 5/12* (2006.01)

(52) U.S. Cl.
USPC .................. 252/519.3; 252/520.1; 252/520.2; 252/521.2; 252/521.3; 252/521.5; 427/98.4; 427/123

(58) Field of Classification Search
USPC .......... 252/519.3, 520.1, 520.2, 521.2, 521.3, 252/521.5; 427/98.4, 123
See application file for complete search history.

(56) References Cited

U.S. PATENT DOCUMENTS

| | | | | |
|---|---|---|---|---|
| 6,057,232 A | * | 5/2000 | Lee | 438/658 |
| 2007/0187812 A1 | | 8/2007 | Izumi | |
| 2007/0293000 A1 | * | 12/2007 | Yang et al. | 438/171 |
| 2010/0151323 A1 | | 6/2010 | Naito et al. | |
| 2011/0183068 A1 | | 7/2011 | Yamakawa et al. | |

FOREIGN PATENT DOCUMENTS

| | | |
|---|---|---|
| JP | 2006-73863 A | 3/2006 |
| JP | 2006-210872 A | 8/2006 |
| JP | 2010-121206 A | 6/2010 |
| JP | 2010-161331 A | 7/2010 |
| JP | 2010258347 A * | 11/2010 |
| WO | WO 2010/004852 A1 | 1/2010 |

OTHER PUBLICATIONS

Fan et al., "Ti-doped copper nitride films deposited by cylindrical magnetron sputtering," J. Alloys and Compounds, 440, pp. 254-258 (2007).*
Japanese Office Action dated Oct. 24, 2012 issued in Japanese Patent Application No. 2010-224031 (English translation attached).

* cited by examiner

*Primary Examiner* — Mark Kopec
*Assistant Examiner* — Jaison Thomas
(74) *Attorney, Agent, or Firm* — Birch, Stewart, Kolasch & Birch, LLP

(57) ABSTRACT

A wiring material contains copper, nitrogen, and a dopant which is more readily oxidized than copper in an Ellingham diagram, the dopant being added to the wiring material at a rate of not less than 0.5 at. % and not more than 10 at. %.

14 Claims, 2 Drawing Sheets

WIRING MATERIAL, METHOD OF MANUFACTURING WIRING, AND NANO-PARTICLE DISPERSION

BACKGROUND OF THE INVENTION

1. Field of the Invention

The present invention relates to a wiring material, a method of manufacturing wiring and a nano-particle dispersion, more particularly to a wiring material suitable for forming an electric wiring (electrode) pattern by a direct printing method such as an inkjet method, and wire forming technology using same.

2. Description of the Related Art

Japanese Patent Application Publication Nos. 2006-210872 and 2010-121206 disclose technology for forming a wiring pattern on a substrate by ejecting and depositing a paste (dispersion) in which metal nano-particles are dispersed in an organic dispersion medium, onto the substrate by an inkjet method. In Japanese Patent Application Publication No. 2006-210872, copper metal nano-particles are used as material for forming a wiring pattern, and a copper nitride film is formed on the surface of each copper metal nano-particle. In Japanese Patent Application Publication No. 2010-121206, a metal film is produced by thermal reduction of a composition including copper nitride.

However, in these methods in the related art, low-resistance wires (electrodes) cannot be obtained unless the material is heated to a very high temperature. Moreover, as stated in Japanese Patent Application Publication No. 2006-210872, paragraph 0016, although low resistance is achieved by a calcination process, there is a problem in selecting the atmosphere, for instance, carrying out the process in a reduction gas atmosphere such as atomic hydrogen in the vicinity of 200° C. Furthermore, since copper readily oxidizes depending on the storage conditions, there is also a problem of poor stability of the material.

SUMMARY OF THE INVENTION

The present invention has been contrived in view of these circumstances, an object thereof being to provide a wiring material which is stable in an oxygen atmosphere and has low resistance, without calcination; a wiring material which can be calcined at a lower temperature, when carrying out calcination; a method of manufacturing wire using a wiring material of this kind; and a nano-particle dispersion.

In order to attain the aforementioned object, the present invention is directed to a wiring material comprising copper, nitrogen, and a dopant which is more readily oxidized than copper in an Ellingham diagram, the dopant being added to the wiring material at a rate of not less than 0.5 at. % and not more than 10 at. %.

According to this aspect of the present invention, it is possible to provide a wiring material which is not liable to oxidize and which has low resistance at room temperature (an initial state before heat treatment), compared to a conventional wiring material. Furthermore, according to the present invention, it is possible to lower the temperature of reduction by calcination, compared to a conventional wiring material.

Preferably, the dopant includes at least one of Si, Zr, Ti, Ni, Sn, Mn and Al.

It is desirable that the dopant is a metal or metalloid element, for example, Si, Zr, Ti, Ni, Sn, Mn or Al. Each of the metal or metalloid is more readily oxidized than copper, and is therefore appropriate as the dopant for suppressing oxidization of copper and reducing the resistivity. It is possible to use any one type of the dopants or a combination of two or more types of the dopants.

Preferably, the wiring material is formed by adding the dopant to copper nitride.

According to this aspect of the present invention, it is possible to provide the wiring material which is not liable to oxidize and which has low resistance, compared to a wiring material made of copper nitride only (dopant-free). Furthermore, it is possible to achieve thermal reduction at a low temperature, compared to a conventional wiring material.

Preferably, the wiring material has a resistivity of not higher than $3.2 \times 10^{-4}$ Ωcm in an unheated state.

The wiring material according to this aspect of the present invention has low resistivity in an unheated state (initial state) compared to a conventional wiring material and therefore can be used for wiring without calcination. Furthermore, the wiring material according to the present invention is a material which is highly robust with respect to temperature change (a material of resistivity having little temperature dependence), due to having a small difference between the resistivity in the unheated state (initial state) and the resistivity after calcination, compared to a conventional wiring material.

Preferably, a ratio between a resistivity of the wiring material after calcination at 300° C. and a resistivity of the wiring material at room temperature before calcination is not more than 0.55.

The wiring material according to an aspect of the present invention is reduced to metallic copper due to release of nitrogen from the wiring material upon calcination, and therefore the resistivity after calcination is lower than the resistivity before calcination. Looking at the ratio between the resistivities before and after the calcination ("resistivity after calcination"/"resistivity before calcination"), it is desirable to employ a material in which the resistivity after calcination is not greater than half the resistivity at room temperature before calcination.

In order to attain the aforementioned object, the present invention is also directed to a method of manufacturing wiring, comprising: a wiring material deposition step of depositing the above-described wiring material onto a substrate; and a heat treatment step of reducing the wiring material deposited on the substrate to copper by heating.

As a method for forming a wiring pattern by depositing the wiring material on a substrate, it is possible to use an inkjet method, a screen printing method, a transfer printing method, a vapor phase method, or the like.

According to this aspect of the present invention, it is possible to carry out reduction processing at a lower temperature compared to a conventional wiring material, and the range of selection of the base material for the substrate is broad.

Preferably, a heating temperature in the heat treatment step is not higher than 300° C.

According to experimentation, in the case of copper nitride which is not doped with any dopant, the resistivity does not fall sufficiently unless heated to 300° C. or above. On the other hand, according to an aspect of the present invention, it is possible to achieve a low resistivity which is desirable for wiring, at a heating temperature at or below 300° C.

Preferably, the heating in the heat treatment step is carried out under reduced pressure.

The calcination temperature is lowered by setting the atmosphere during heating of the wiring material to a reduced pressure. Furthermore, by performing the calcination of the wiring material under the reduced pressure, it is possible to lower the resistance of the wiring material even further, compared to calcination at atmospheric pressure.

Preferably, the pressure in the heat treatment step is not higher than 1000 Pa.

The lower the pressure (the higher the degree of vacuum) during the calcination of the wiring material, the greater the reduction in resistance of the wiring material achieved at a lower temperature. Heat treatment of the wiring material is carried out under a reduced pressure of desirably not higher than 100 Pa and more desirably, not higher than 10 Pa.

In order to attain the aforementioned object, the present invention is also directed to a nano-particle dispersion which is obtained by dispersing nano-particles of the above-described wiring material in a dispersion medium.

In order to attain the aforementioned object, the present invention is also directed to a nano-particle dispersion which is obtained by dispersing, in a dispersion medium, copper nano-particles of which surfaces are coated with film of the above-described wiring material.

The nano-particle dispersion according to these aspect of the present invention is a conductive dispersion in the form of a paste or an ink (conductive ink), and is suitable for forming wiring by an inkjet method, or the like.

Furthermore, the nano-particle dispersion according to these aspects of the present invention is not liable to oxidize and has high stability as a material and enables easy storage. The average particle size of the nano-particles in the nano-particle dispersion is desirably in the range of 1 nm to 100 nm, and more desirably, in the range of 5 nm to 50 nm.

In order to attain the aforementioned object, the present invention is also directed to a method of manufacturing wiring, comprising a step of forming a wiring pattern by depositing the above-described nano-particle dispersion onto a substrate.

After the wiring pattern formation step of depositing the nano-particle dispersion onto the substrate, it is possible to use the wiring material for wiring without calcination of the wiring material deposited on the substrate, or it is possible to calcine the wiring material which has been deposited on the substrate. Further lowering of the resistance is possible by applying a heat treatment step for heating the wiring material contained in the nano-particle dispersion deposited on the substrate and thereby reducing the wiring material to copper.

In order to attain the aforementioned object, the present invention is also directed to a method of manufacturing wiring, comprising: a wiring pattern formation step of forming a wiring pattern by depositing the above-described nano-particle dispersion onto a substrate by an inkjet method; and a calcination step of calcining the wiring material contained in the nano-particle dispersion having been deposited on the substrate, under reduced pressure.

According to this aspect of the present invention, it is possible to obtain fine copper wiring of low resistance (wiring having copper as a main component).

According to the present invention, it is possible to provide a wiring material which is not liable to oxidize, which is stable in an oxygen atmosphere and which has low resistance. Furthermore, it is possible to perform reduction by calcination of the wiring material at a low temperature compared to a conventional wiring material.

BRIEF DESCRIPTION OF THE DRAWINGS

The nature of this invention, as well as other objects and advantages thereof, will be explained in the following with reference to the accompanying drawings, in which like reference characters designate the same or similar parts throughout the figures and wherein.

DETAILED DESCRIPTION OF THE PREFERRED EMBODIMENTS

Practical Examples 1 to 7

Figure 1:
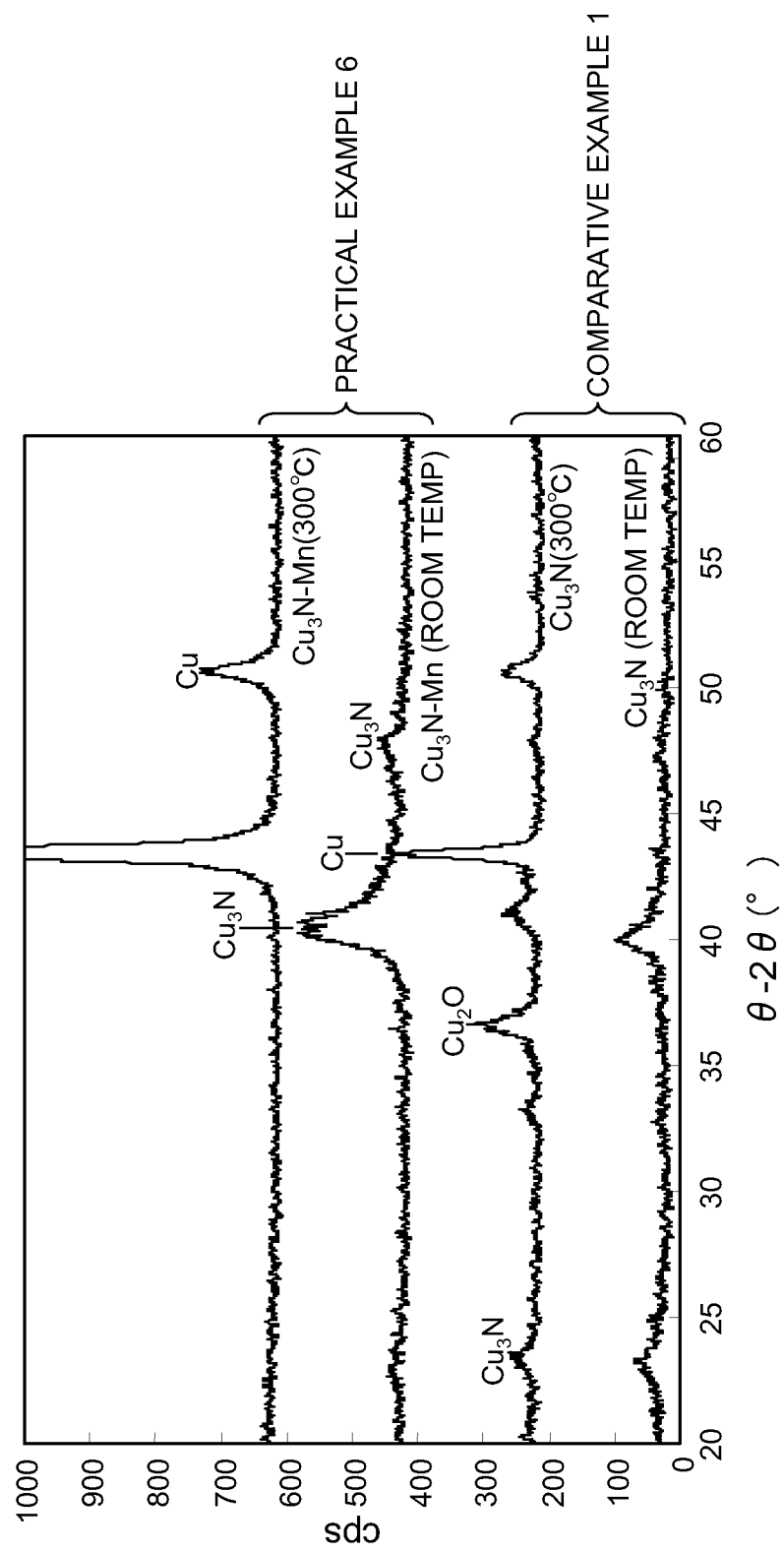
FIG. 1 is a diagram showing X-ray diffraction patterns of wiring material ($Cu_3N$—Mn) according to an embodiment of the present invention.

Wiring material according to an embodiment of the present invention is composed of copper nitride ($Cu_3N$) doped with a non-noble metal or metalloid that oxidizes more readily than copper, at a rate of not less than 1 at. % (atomic percent) and not more than 10 at. %.

In Practical Examples 1 to 7 of the present invention shown in the following Table 1, copper nitride was doped with various dopants (non-noble metals and metalloid) at a rate of about 2 at. %.

TABLE 1

| Material | | Resistivity ($\Omega$cm) at room temperature | Resistivity ($\Omega$cm) after calcination at 300° C. and 1000 Pa |
|---|---|---|---|
| Practical Example 1 | $Cu_3N$—Si | $1.9 \times 10^{-4}$ | $6.4 \times 10^{-5}$ |
| Practical Example 2 | $Cu_3N$—Zr | $2.5 \times 10^{-4}$ | $6.0 \times 10^{-5}$ |
| Practical Example 3 | $Cu_3N$—Ti | $1.7 \times 10^{-4}$ | $3.2 \times 10^{-5}$ |
| Practical Example 4 | $Cu_3N$—Ni | $3.2 \times 10^{-4}$ | $6.0 \times 10^{-5}$ |
| Practical Example 5 | $Cu_3N$—Sn | $1.7 \times 10^{-4}$ | $2.5 \times 10^{-5}$ |
| Practical Example 6 | $Cu_3N$—Mn | $2.8 \times 10^{-4}$ | $3.7 \times 10^{-5}$ |
| Practical Example 7 | $Cu_3N$—Al | $4.0 \times 10^{-5}$ | $2.2 \times 10^{-5}$ |
| Comparative Example 1 | $Cu_3N$ | $5.0 \times 10^{-4}$ | $6.0 \times 10^{-4}$ |

The material used was obtained by adding each of the dopants (metalloid and non-noble metals) to a copper (Cu) target by sputtering, and forming to a thickness of 220 nm at room temperature. The crystalline structure of the material thus obtained was confirmed by X-ray diffraction (XRD) to contain copper nitride ($Cu_3N$). It is possible to include an amorphous component in the material. Furthermore, there can be portion of copper component that is not nitride.

The resistivities of the respective materials thus obtained in Practical Examples 1 to 7 were measured at room temperature to be $4.0 \times 10^{-5}$ $\Omega$cm to $3.2 \times 10^{-4}$ $\Omega$cm, as shown in Table 1.

Then, the films of the respective materials were heated to 300° C. under reduced pressure of approximately 1000 Pa, and subjected to calcination at 300° C. for 10 minutes. By this means, it was confirmed that each of the materials became to have a lower resistivity than the resistivity at room temperature (see Table 1). This is thought to be because the calcination causes copper nitride ($Cu_3N$) to release nitrogen to produce metallic copper (Cu) (i.e., to be reduced to copper).

The dopants (Si, Zr, Ti, Ni, Sn, Mn, Al) used in Practical Examples 1 to 7 in Table 1 are all elements which oxidize more readily than copper. It can be readily seen that the dopant oxidizes more readily than copper, from the Ellingham diagram showing the relationship of the Gibbs free energy change for the oxidation reaction versus the temperature.

The dopants are not limited to the examples given here, and other elements may also be used provided that they are more readily oxidized than copper. In view of Ellingham diagrams, it is possible to select elements which are more readily oxidized than copper, as dopants. It is thought that the obtained wire can have a low resistance since the dopant prevents oxidization of copper by oxidizing before copper does.

Although the material in each of Practical Examples 1 to 7 is doped with a single dopant, it is also possible that two or more dopants are added together. Moreover, the metalloid or the non-noble metal used as the dopant may be in a metallic state, or a nitride state, or an alloyed state with copper.

Comparative Example 1

In Comparative Example 1 in Table 1, the material in which copper nitride was not doped with any dopant (i.e., dopant-free copper nitride) was prepared. The resistivity of the material ($Cu_3N$) of Comparative Example 1 at room temperature was $5.0\times10^{-4}$ $\Omega$cm, which was higher than those of the materials of Practical Examples 1 to 7 which were doped with the dopants. Furthermore, after the material ($Cu_3N$) of Comparative Example 1 was subjected to calcination at 300° C. under reduced pressure of approximately 100 Pa for 10 minutes, the material became to have the resistivity of $6.0\times10^{-4}$ $\Omega$cm, which was higher than that in the initial state (before the calcination). Although the reason for this phenomenon is not sufficiently clear, it is thought to be because nitrogen has not been released sufficiently by the calcination and copper has oxidized due to slight traces of oxygen inside the calcination apparatus.

<Comparison Between the Materials of Practical Examples 1 to 7 and the Material of Comparative Example 1>

As shown in Table 1, each of the materials of Practical Examples 1 to 7 has lower resistivity at room temperature (resistivity in an unheated state) than the material of Comparative Example 1, and is good for use as wiring material.

FIG. 1 shows X-ray diffraction (XRD) patterns for reference purposes. FIG. 1 is a diagram showing an X-ray diffraction pattern for the material of Practical Example 6 in which copper nitride is doped with manganese (Mn) at approximately 2 at. %. The vertical axis in FIG. 1 represents the XRD intensity, taking the number of counts per second (cps) as the unit. In FIG. 1, an X-ray diffraction pattern for the material of Comparative Example 1 in which copper nitride is not doped with any dopant is also shown for the purpose of comparison.

As shown in FIG. 1, the material of Comparative Example 1 ($Cu_3N$) and the material of Practical Example 6 ($Cu_3N$—Mn) both showed only peaks of $Cu_3N$ at room temperature, and some of the materials changed to pure copper by heat treatment at 300° C. However, in the dopant-free material of Comparative Example 1, even after the heat treatment was carried out, pure copper was not sufficiently produced and the peaks of $Cu_3N$ and a peak of $Cu_2O$ were observed.

On the other hand, the material of Practical Example 6 which was doped with Mn produced copper single-phase by the heat treatment at 300° C., and the strong peaks of copper were observed. These results coincide with the results of the resistance change caused by the heat treatment or calcination (see FIG. 2).

In the material of Practical Example 7 in which copper nitride was doped with aluminum (Al) instead of manganese (Mn) in the material of Practical Example 6, upon calcination at 300° C. under a lower pressure of 10 Pa, the resistivity dropped significantly to $6.2\times10^{-6}$ $\Omega$cm.

By heating under a reduced pressure atmosphere when carrying out the calcination, it is possible to further lower the resistivity, and more beneficial effects are obtained, the higher the degree of vacuum.

Practical Example 8

Figure 2:
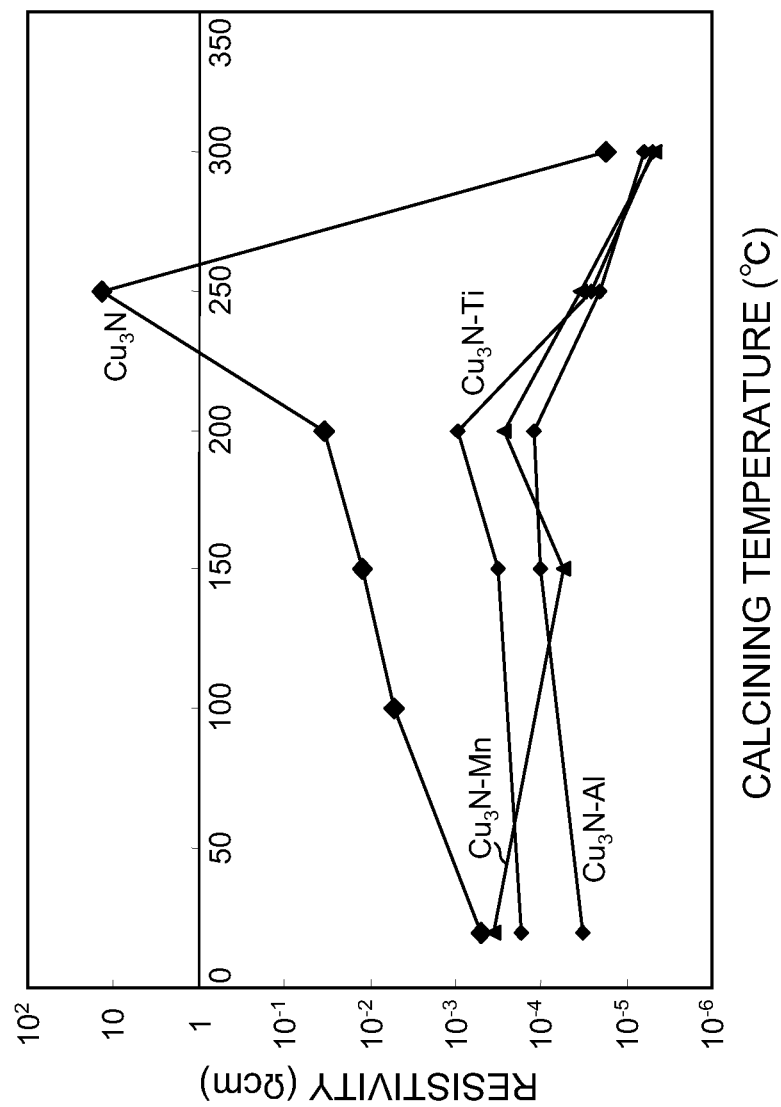
FIG. 2 is a graph showing the relationship between temperature and resistivity of wiring materials ($Cu_3N$—Ti, $Cu_3N$—Mn, $Cu_3N$—Al) according to the embodiment of the present invention.

Change in resistivity due to changing the temperature under the reduced pressure of 10 Pa was investigated for the material of Comparative Example 1 (dopant-free material) and the materials of Practical Example 3 (doped with Ti), Practical Example 6 (doped with Mn) and Practical Example 7 (doped with Al), which are shown in Table 1. The corresponding results are shown in FIG. 2, where the horizontal axis represents the heating temperature (° C.) and the vertical axis represents the resistivity ($\Omega$cm). Here, the materials in which copper nitride was doped with the dopants (Ti, Mn, Al) at approximately 1 at. % were used.

As shown in FIG. 2, the resistances of the materials ($Cu_3N$—Ti, $Cu_3N$—Mn, $Cu_3N$—Al) in which copper nitride ($Cu_3N$) was doped with the dopants (Ti, Mn, Al) all started to lower at or below 250° C., and the materials suitable for use as wiring could be obtained at lower temperature than the dopant-free material ($Cu_3N$) in Comparative Example 1.

For example, focusing in particular on $Cu_3N$—Al, the resistivity at room temperature was $3.3\times10^{-5}$ $\Omega$cm, and when the material was heated to 200° C., the resistivity slightly rose to $1.2\times10^{-4}$ $\Omega$cm, but this was a satisfactory value. Moreover, when the material was heated to 250° C., the resistivity fell to $2.1\times10^{-5}$ $\Omega$cm, and when the material was heated to 300° C., the resistivity similar to that of pure copper, $6.2\times10^{-6}$ $\Omega$cm was obtained, which was sufficient as a wiring material.

Comparative Example 2

With respect to the material in which copper nitride was not doped with any dopant (dopant-free $Cu_3N$), the resistivity at room temperature was the order of $1\times10^{-4}$ $\Omega$cm, and the resistivity gradually rose as the temperature rose due to the heating. The resistivity continued to rise until the temperature reached 250° C., and the resistivity did not start to lower unless the temperature reached 250° C. to 300° C. When the heating temperature passed 250° C. and reached 300° C., the resistivity significantly fell to a value close to that of pure copper.

<Temperature Dependence of Resistivity>

As describe above, the respective materials of $Cu_3N$—Ti, $Cu_3N$—Mn and $Cu_3N$—Al (each doped with the dopant at approximately 1 at. %) according to the embodiment of the present invention have lower resistivity at room temperature and less temperature dependence (smaller change in resistivity with respect to change in temperature), compared to $Cu_3N$ (dopant-free material).

In the case of Practical Examples 1 to 7 in Table 1, when the ratio between the resistivity after the calcination and the resistivity before the calcination (the resistivity at room temperature) was investigated, the ratio ("resistivity after calcination"/"resistivity before calcination") was in the range of approximately 0.13 to 0.55. The ratio of resistivities had a largest value of 0.55 in the material of Practical Example 7 ($Cu_3N$—Al), and the ratio of resistivities had a smaller value than this in each of the materials in the other Practical Examples 1 to 6.

In the case of the materials according to the embodiments of the present invention ($Cu_3N$—Ti, $Cu_3N$—Mn, $Cu_3N$—Al, and the like), low-resistance materials are obtained at a lower temperature (not higher than 300° C.), and therefore these materials are desirable to form wiring from the viewpoint of material robustness and the range of selection of the base material.

<Added Amount of Dopant>

The upper limit of the added amount of the dopant varies with the application, and if a resistivity of a similar level to copper which is the main component of the wiring material is demanded, then it is desirable that the added amount of the dopant is not more than 10 at. %. If the added amount of the dopant exceeds 10 at. %, then the resistivity of the material after the calcination is five or more times greater than in the case of copper alone. This is because the doped material theoretically contains metal or metalloid having a higher resistance than copper. More desirably, the upper limit of the added amount of the dopant is not more than 5 at. %.

Desirably, the lower limit of the added amount of the dopant is not less than 0.5 at. % and more desirably, not less than 1 at. %. On the basis of experimentation into different added amounts of the dopant, considerable beneficial effects were obtained when the dopant was added at not less than 0.5 at. % and clear beneficial effects were obtained when the dopant was added at 1 at. %.

Practical Example 9

The material in which copper nitride ($Cu_3N$) was doped with nickel (Ni) at a rate of 5 at. % was prepared. When the material was calcined at 300° C. under reduced pressure (10 Pa), the resistivity was measured to be $8 \times 10^{-5}$ Ωcm. For example, the resistivity of a bulk copper is $1.7 \times 10^{-5}$ Ωcm.

Similar experimentation was carried out by changing the added amount of Ni and using the material in which $Cu_3N$ was doped with Ni at a rate of 7 at. %. The resistivity after the calcination at 300° C. in this case was $1 \times 10^{-4}$ Ωcm, which was higher than the case where the added amount was 5 at. %.

As the added amount of dopant increases, the resistivity tends to approach the resistance of the dopant, and therefore, it is desirable for the amount (rate) of copper, which has lower resistance among metals, to be large. From findings based on experimentation, it is desirable that the upper limit of the added amount of the dopant is not more than 10 at. %.

<Effects of Heating Under Reduced Pressure>

By the experimentation of various types described above, it was discovered that it was possible to lower the temperature of calcination when the heating was carried out under reduced pressure. During calcination, it is desirable that the pressure is reduced to not higher than 1000 Pa, more desirably, not higher than 100 Pa, and even more desirably, not higher than 10 Pa.

<Mode of Wiring Material Desirable for Image Formation of Wiring by Inkjet Method>

<<Example 1 of Conductive Ink>>

A nano-particle dispersion (conductive ink) can be manufactured by forming nano-particles (for example, having an average particle size of approximately 8 nm) of a material in which copper nitride is doped with a dopant that is more readily oxidized than copper (for example, Si, Zr, Ti, Ni, Sn, Mn, Al, or the like) at a rate of not less than 0.5 at. % and not more than 10 at. %, and dispersing the nano-particles into an alcohol dispersion medium or other dispersion medium.

<<Example 2 of Conductive Ink>>

Alternatively, it is also possible to manufacture a nano-particle dispersion (conductive ink) by coating copper nano-particles with a coating film (anti-oxidation film) of a material in which copper nitride is doped with a dopant that is more readily oxidized than copper (for example, Si, Zr, Ti, Ni, Sn, Mn, Al, or the like) at a rate of not less than 0.5 at. % and not more than 10 at. %, and dispersing the coated copper nano-particles into a dispersion medium.

It is possible to form a wiring pattern on a substrate by ejecting the above-described nano-particle dispersion (conductive ink) in each of Examples 1 and 2 of conductive ink from a liquid ejection head of an inkjet apparatus, and depositing the ejected dispersion onto the substrate.

<<Concrete Examples of Conductive Inks>>

Copper nitride, and copper nitride doped with the dopant, were manufactured by vapor deposition in gas. There are no particular restrictions on the method of manufacture, and it is possible to use a vapor phase method, such as vapor deposition or an arc method, or a liquid phase method. With either of these methods, it is important to obtain a desired composition.

The manufactured material was formed into nano-particles, to obtain nano-particles of the material. The nano-particles having an average particle size of approximately 8 nm were prepared. The average particle size is not limited to this size and can be selected appropriately in a range of not smaller than 1 nm and not larger than 100 nm, and it is particularly desirable that a particle size is in a range of not smaller than approximately 5 nm and not larger than approximately 50 nm.

Then, in order to disperse the nano-particles of the material, methyl hexahydrophthalic anhydride was added to the nano-particles and the viscosity of the dispersion or liquid was adjusted to 10 mPa·s (at 25° C.). A wiring pattern was formed on a glass substrate by an inkjet apparatus using this nano-particle dispersion. The wiring pattern formed was a typical pattern having a line width of 20 μm and a thickness of 3 μm.

Good pattern formation was possible with each of the materials in Practical Examples 1 to 7 in Table 1 in which the respective dopants were added.

Practical Example 10

For example, a material in which copper nitride was doped with titanium (Ti) was manufactured by vapor deposition in ammonia gas. Nano-particles of the material having an average particle size of approximately 8 nm were prepared. In order to disperse the doped copper nitride particles, methyl hexahydrophthalic anhydride was added and the viscosity of the dispersion or liquid was adjusted to 10 mPa·s (at 25° C.). By using the nano-particle dispersion which had been thus formed into an ink, a wiring pattern was formed on a glass substrate by an inkjet apparatus. The wiring pattern formed was a typical pattern having a thickness of 3 μm. Good pattern formation was possible.

The material thus obtained had high resistance at room temperature, but by calcination at 250° C. under reduced pressure of approximately 10 Pa, the resistivity became approximately $2 \times 10^{-5}$ Ωcm, and a satisfactory material for wiring was obtained.

Comparative Example 3

Similarly to Practical Example 10, nano-particles of copper nitride with no dopant (average particle size: approximately 8 nm) were dispersed in methyl hexahydrophthalic anhydride, and the viscosity of the dispersion or liquid was adjusted to 10 mPa·s (at 25° C.). By using the nano-particle dispersion which had been thus formed into an ink, a wiring pattern was formed on a glass substrate by an inkjet apparatus. Then, similarly to Practical Example 10, the material was calcined at 250° C. under reduced pressure of approximately 10 Pa, but the resistivity of the wiring thus obtained was a high value of approximately $6\times10^{-3}$ Ωcm.

As described above, it is possible to form good low-resistance wiring having copper as a main component, by using the materials in Practical Examples 1 to 10 of the present invention.

Although the aforementioned description relating to application of the present invention centered principally on copper nitride formed by uniform reaction of copper and nitrogen, it is also possible to use nano-particles in which doped copper nitride is situated about the peripheries of copper particles. Moreover, it is also possible to adopt a core-shell structure using doped copper nitride as a protective layer on the surface of the wiring material.

It should be understood that there is no intention to limit the invention to the specific forms disclosed, but on the contrary, the invention is to cover all modifications, alternate constructions and equivalents falling within the spirit and scope of the invention as expressed in the appended claims.

What is claimed is:

1. A wiring material comprising copper, nitrogen, and a dopant which is more readily oxidized than copper in an Ellingham diagram, the dopant being added to the wiring material at a rate of not less than 0.5 at. % and not more than 10 at. %, wherein the wiring material has a resistivity of not higher than $3.2\times10^{-4}$ Ωcm in an unheated state.

2. The wiring material as defined in claim 1, wherein the dopant includes at least one of Si, Zr, Ti, Ni, Sn, Mn and Al.

3. The wiring material as defined in claim 1, wherein the wiring material is formed by adding the dopant to copper nitride.

4. The wiring material as defined in claim 1, wherein a ratio between a resistivity of the wiring material after calcination at 300° C. and a resistivity of the wiring material at room temperature before calcination is not more than 0.55.

5. A method of manufacturing wiring, comprising:
a wiring material deposition step of depositing the wiring material as defined in claim 1 onto a substrate; and
a heat treatment step of reducing the wiring material deposited on the substrate to copper by heating.

6. The method as defined in claim 5, wherein a heating temperature in the heat treatment step is not higher than 300° C.

7. The method as defined in claim 5, wherein the heating in the heat treatment step is carried out under reduced pressure.

8. The method as defined in claim 7, wherein the pressure in the heat treatment step is not higher than 1000 Pa.

9. A nano-particle dispersion which is obtained by dispersing nano-particles of the wiring material as defined in claim 1 in a dispersion medium.

10. A method of manufacturing wiring, comprising a step of forming a wiring pattern by depositing the nano-particle dispersion as defined in claim 9 onto a substrate.

11. A method of manufacturing wiring, comprising:
a wiring pattern formation step of forming a wiring pattern by depositing the nano-particle dispersion as defined in claim 9 onto a substrate by an inkjet method; and
a calcination step of calcining the wiring material contained in the nano-particle dispersion having been deposited on the substrate, under reduced pressure.

12. A nano-particle dispersion which is obtained by dispersing, in a dispersion medium, copper nano-particles of which surfaces are coated with film of the wiring material as defined in claim 1.

13. A method of manufacturing wiring, comprising a step of forming a wiring pattern by depositing the nano-particle dispersion as defined in claim 12 onto a substrate.

14. A method of manufacturing wiring, comprising:
a wiring pattern formation step of forming a wiring pattern by depositing the nano-particle dispersion as defined in claim 12 onto a substrate by an inkjet method; and
a calcination step of calcining the wiring material contained in the nano-particle dispersion having been deposited on the substrate, under reduced pressure.

* * * * *